(12) United States Patent
Chan et al.

(10) Patent No.: US 10,263,607 B1
(45) Date of Patent: Apr. 16, 2019

(54) PULSE FILTERING CIRCUIT

(71) Applicant: Mosway Technologies Limited, New Territories, Hong Kong (CN)

(72) Inventors: On Bon Peter Chan, Hong Kong (CN); Jing Zhu, Jiangsu Province (CN); Yunwu Zhang, Jiangsu Province (CN)

(73) Assignee: Mosway Technologies Limited, Fo Tan, New Territories, Hong Kong (CN)

( * ) Notice: Subject to any disclaimer, the term of this patent is extended or adjusted under 35 U.S.C. 154(b) by 0 days.

(21) Appl. No.: 16/105,678

(22) Filed: Aug. 20, 2018

(30) Foreign Application Priority Data

Sep. 29, 2017  (CN) .......................... 2017 1 0909428

(51) Int. Cl.
*H03K 5/1252* (2006.01)
*H03K 5/24* (2006.01)
*H03H 11/04* (2006.01)
*H03K 19/0948* (2006.01)
*H03K 3/356* (2006.01)
*H03K 19/20* (2006.01)

(52) U.S. Cl.
CPC ........... *H03K 5/1252* (2013.01); *H03H 11/04* (2013.01); *H03K 5/2472* (2013.01); *H03K 19/0948* (2013.01); *H03K 3/356* (2013.01); *H03K 19/20* (2013.01)

(58) Field of Classification Search
CPC ....... H03K 5/1252; H03K 2005/00247; H03K 5/135; H03K 5/24; H03K 5/249; H03K 5/26; H03K 5/01; H03K 3/0315; H03K 5/13; H03K 5/19

USPC ................................. 327/143, 198, 551, 552
See application file for complete search history.

(56) References Cited

U.S. PATENT DOCUMENTS

| 4,319,204 A | * | 3/1982 | Weldon | H03C 1/50 332/113 |
| 4,346,354 A | * | 8/1982 | Hanna | H03C 1/50 332/152 |
| 5,436,934 A | * | 7/1995 | Co | H04B 1/1027 375/317 |

* cited by examiner

*Primary Examiner* — John W Poos
(74) *Attorney, Agent, or Firm* — Alix, Yale & Ristas, LLP

(57) ABSTRACT

The present disclosure provides a pulse filtering circuit with two input ports and two output ports, including: a first signal path with a first buffer unit, a first comparison unit, and a first shaping unit; and a second signal path with a second buffer unit, a second comparison unit, and a second shaping unit; each of the first comparison unit and the second comparison unit has four ports, which are a first port, a second port, a third port and a fourth port; the first port of each comparison unit serves as an input control port, the second port of each comparison unit serves as an output port, the third port serves as a fixed potential port, and the fourth port serves as a floating potential input port. The new pulse filtering circuit of the present disclosure may eliminate the common-mode noise signal, especially the dV/dt common-mode noise generated by the power supply, and therefore the circuit has a strong anti-dV/dt noise capability and a small transmission delay, and at the same time reduces the chip area and production costs due to its simple circuit structure.

20 Claims, 8 Drawing Sheets

PULSE FILTERING CIRCUIT

FIELD

The present disclosure relates to a circuit with a high voltage driving technology, and more particularly to a new pulse filtering circuit of a high voltage floating gate driver circuit with high noise immunity, which belongs to the field of integrated circuits.

BACKGROUND

As shown in FIG. 1, a high side gate driver circuit 101 in the related art is such an integrated circuit that controls a high voltage power switching device to be turned on or off with a medium voltage signal, and is widely used in fields of motor driving, resonant power supply and the like, because it may effectively control a half bridge connected power switching device.

The high side gate driver circuit 101 is often used to drive a high-side switching device in a half-bridge structure, while a low-side switching device in the half-bridge structure is driven by a low side gate driver circuit 102. A basic topology of the half-bridge structure is shown in FIG. 1, in which $M_H$ and $M_L$ are a high-side power switching device and a low-side power switching device in the half-bridge structure, respectively. The half-bridge topology is externally connected with a high voltage bus voltage and an HV. A half-bridge driving circuit 100 includes a high side gate driver circuit 101 and a low side gate driver circuit 102. An output signal HO of the high side gate driver circuit 101 drives the high-side power switching device $M_H$, and an output signal LO of the low side gate driver circuit 102 drives the low-side power switching device $M_L$.

In order to improve utilization efficiency of a power supply, the half-bridge driving circuit 100 adopts a single power supply mode, low/medium voltage circuits in the low side gate driver circuit 102 and the high side gate driver circuit 101 are powered by the low-side fixed power supply VCC, and a high voltage circuit in the high side gate driver circuit 101 is powered by VCC through a bootstrap diode $D_B$ and a bootstrap capacitor $C_B$. A power supply voltage VB of the high voltage circuit in the high side gate driver circuit 101 and a reference ground VS are floating voltages. When the output signal HO of the high side gate driver circuit 101 is a high level VB and the output signal LO of the low side gate driver circuit 102 is a low level COM, the high-side power switching device $M_H$ is turned on, the low-side power switching device $M_L$ is turned off, the VS voltage increases, and the VB voltage also increases with the increase of the VS voltage; on the contrary, when the HO is at the low level and the LO is at the high level, $M_H$ is turned off, $M_L$ is turned on, and the VS voltage and the VB voltage are dropped. In order to reduce power consumption and improve reliability of the circuit, a mode of controlling the high voltage power switching device by double narrow pulses is often adopted in the high side gate driver circuit 101 to realize a high voltage level shift, that is, the high-side input signal is converted into two narrow pulses which represent a rising edge and a falling edge of the high-side input signal, respectively, thereby greatly reducing the turn-on time of the high voltage power switching device of the high voltage level shifter.

As shown in FIG. 2a, the high side gate driver circuit 101 in the related art includes a narrow pulse generating circuit 200, a high voltage level shift circuit 201, a pulse filtering circuit 202, an RS flip-flop 203, and a gate driver circuit 204.

The narrow pulse generating circuit 200 converts the rising edge and the falling edge of the high-side input signal HIN into two narrow pulse signals SET and RESET, respectively. SET and RESET control high voltage switching devices M1 and M2 in the high voltage level shift circuit 201, respectively. Two output signals of the high voltage level shift circuit 201 are connected with two input signals of the pulse filtering circuit 202. Two output signals of the pulse filtering circuit 202 serve as a set input end $\overline{S}$ and a reset input end $\overline{R}$ of the RS flip-flop 203, respectively. An output end of the RS flip-flop 203 is connected with an input end of the gate driver circuit 204, and an output signal of the gate driver circuit 204 is HO.

A function of the narrow pulse generating circuit 200 is to convert the high-side input signal HIN into two narrow pulses, which represent the rising edge and the falling edge of the high-side input signal HIN, respectively, and are used to drive the high voltage power switching devices M1, M2. The high voltage level shift circuit 201 includes the high voltage switching devices M1 and M2, load resistors $R_{L1}$ and $R_{L2}$, and zener diodes Z1 and Z2. The function of the high voltage level shift circuit 201 is to convert pulse signals SET and RESET of the low/medium voltage circuit into signals VDS and VDR of the high voltage circuit, respectively.

As shown in FIG. 2b and FIG. 1, since the high side gate driver circuit 101 is powered by a floating power supply, a dV/dt stress is generated due to the variation of the VS voltage, and is coupled to the floating power supply VB through the bootstrap capacitor $C_B$, thereby resulting in internal noise in the high side gate driver circuit 101, which may cause a variation of the HO state and cause the $M_H$ to be turned on or off mistakenly. During the rising of VS voltage, i.e., a positive dV/dt stress is generated, the internal noise generated thereby is usually easier to cause the MH to be turned on or off mistakenly.

A conventional method to solve the dV/dt noise is to adopt a RC filtering form. As shown in FIG. 3, the pulse filtering circuit 202a consists of digital inverters 300, 301, 302 and 303, resistors $R_{F1}$ and $R_{F2}$ and capacitors $C_{F1}$ and $C_{F2}$. The function of the pulse filtering circuit 202a is to filter input signals VDS and VDR below a certain pulse width, especially the common-mode noise signal generated by the dV/dt noise. Although this kind of circuit may reduce the influence of dV/dt noise to a certain extent, there are contradictions among anti-dV/dt capability, anti-VS negative bias capability and channel transmission delay which are mutually restricted to one another.

Therefore, the related art is still needed to be improved and developed.

SUMMARY

In order to solve the problem that anti-dV/dt capability, anti-VS negative bias capability and channel transmission delay cannot be reconciled in the high side gate driver circuit in the related art, a new pulse filtering circuit is provided in embodiments of the present disclosure. A high side gate driver circuit using this pulse filtering circuit has a high anti-dV/dt noise capability, a high anti-VS negative bias capability, and a very small channel transmission delay; in addition, the circuit structure is compact, saving chip area.

The technical solutions adopted by the present disclosure are as follows.

A pulse filtering circuit with two input ports and two output ports includes:

a first signal path with a first buffer unit, a first comparison unit, and a first shaping unit; and a second signal path with a second buffer unit, a second comparison unit, and a second shaping unit;

each of the buffer unit includes one or more digital inverters in series, with the input to the first digital inverter serving as the input to the pulse filtering circuit, and an output of the last digital inverter serving as an output of the buffer unit, optionally such buffer unit can be omitted; and each of the first comparison unit and the second comparison unit has four ports, which are a first port, a second port, a third port and a fourth port;

the first port of each comparison unit serves as an input control port, the second port of each comparison unit serves as an output port, the third port serves as a fixed potential port, and the fourth port serves as a floating potential input port; and the output of the first buffer unit connects to the input control port of the first comparison unit and the floating potential input port of the second comparison unit, the output of the second buffer unit connects to the input control port of the second comparison unit and the floating potential input port of the first comparison unit, or alternatively the output of the first buffer unit connects to the input control port of the second comparison unit and the floating potential input port of the first comparison unit, the output of the second buffer unit connects to the input control port of the first comparison unit and the floating potential input port of the second comparison unit; and signal from each of the floating potential input port is passed to the corresponding output port when a voltage difference between the corresponding input control port and the floating potential input port exceeds a voltage threshold of the comparison unit, otherwise the corresponding output port provides an output equal to the fixed potential at the third port; and the first shaping unit includes one or more digital inverters in series, with an input to the first digital inverter connecting to the output of the first comparison unit, and an output of the last digital inverter serving as a first output of the pulse filtering circuit, and the second shaping unit includes one or more digital inverters in series, with an input to the first digital inverter connecting to the output of the second comparison unit, and an output of the last digital inverter serving as a second output of the pulse filtering circuit; optionally, each such buffer unit can be omitted.

In the pulse filtering circuit, the third port of the first comparison unit and the third port of the second comparison unit are connected with a power supply signal or a ground signal; and the first comparison unit and the second comparison unit each include one or more digital inverters.

In the pulse filtering circuit, the first buffer unit comprises a first digital inverter, and the second buffer unit comprises a second digital inverter.

In the pulse filtering circuit, the first comparison unit comprises a first PMOS transistor and a first NMOS transistor, a gate electrode of the first PMOS transistor and a gate electrode of the first NMOS transistor are connected together to serve as the first port of the first comparison unit, a drain electrode of the first PMOS transistor and a drain electrode of the first NMOS transistor are connected together to serve as the second port of the first comparison unit, a source electrode of the first PMOS transistor serves as the third port of the first comparison unit, and a source electrode of the first NMOS transistor serves as the fourth port of the first comparison unit.

In the pulse filtering circuit, the second comparison unit comprises a second PMOS transistor and a second NMOS transistor, a gate electrode of the second PMOS transistor and a gate electrode of the second NMOS transistor are connected together to serve as the first port of the second comparison unit, a drain electrode of the second PMOS transistor and a drain electrode of the second NMOS transistor are connected together to serve as the second port of the second comparison unit, a source electrode of the second PMOS transistor serves as the third port of the second comparison unit, and a source electrode of the second NMOS transistor serves as the fourth port of the second comparison unit.

In the pulse filtering circuit, the first shaping unit comprises a third digital inverter and a fourth digital inverter, the second shaping unit consists of a fifth digital inverter and a sixth digital inverter; the third port of the first comparison unit and that of the second comparison unit are connected with the power supply signal; and signals at output ends $\overline{S}$ and $\overline{R}$ are changed when an absolute value of a voltage difference between the first port and the fourth port of the first comparison unit or the first port and the fourth port of the second comparison unit is greater than the voltage threshold of the first comparison unit or the voltage threshold of the second comparison unit.

In the pulse filtering circuit, the first buffer unit comprises a seventh digital inverter and an eighth digital inverter, and the second buffer unit comprises a ninth digital inverter and a tenth digital inverter.

In the pulse filtering circuit, the first comparison unit comprises a third PMOS transistor and a third NMOS transistor, a gate electrode of the third PMOS transistor and a gate electrode of the third NMOS transistor are connected together to serve as the first port of the first comparison unit, a drain electrode of the third PMOS transistor and a drain electrode of the third NMOS transistor are connected together to serve as the second port of the first comparison unit, a source electrode of the third PMOS transistor serves as the third port of the first comparison unit, and a source electrode of the third NMOS transistor serves as the fourth port of the first comparison unit.

In the pulse filtering circuit, the second comparison unit comprises a fourth PMOS transistor and a fourth NMOS transistor, a gate electrode of the fourth PMOS transistor and a gate electrode of the fourth NMOS transistor are connected together to serve as the first port of the second comparison unit, a drain electrode of the fourth PMOS transistor and a drain electrode of the fourth NMOS transistor are connected together to serve as the second port of the second comparison unit, a source electrode of the fourth PMOS transistor serves as the third port of the second comparison unit, and a source electrode of the fourth NMOS transistor serves as the fourth port of the second comparison unit.

In the pulse filtering circuit, the first shaping unit comprises an eleventh digital inverter, and the second shaping unit comprises a twelfth digital inverter; the third port of the first comparison unit and the third port of the second comparison unit are connected with the ground signal; and signals at output ends $\overline{S}$ and $\overline{R}$ are changed when an absolute value of a voltage difference between the first port and the fourth port of the first comparison unit or the first port and the fourth port of the second comparison unit is greater than the voltage threshold of the first comparison unit or the voltage threshold of the second comparison unit.

Compared with the related art, the technical solutions adopted in embodiments of the present disclosure have the following advantages and remarkable effects:

(1) The present disclosure overcomes contradictions among anti-dV/dt noise capability, anti-VS negative bias capability and channel transmission delay of the high side gate driver circuit, thus greatly improving the anti-dV/dt noise capability and anti-VS negative bias capability of the high side gate driver circuit;

(2) The present disclosure avoids the use of an R (resistor) C (capacitor) filtering circuit structure, thereby reducing the delay of the circuit channel and improving the signal response speed;

(3) The present disclosure allows a certain process deviation, and the dV/dt noise may not affect the high-side output signal, thereby further improving the anti-dV/dt noise capability and the reliability of the circuit; and (4) The circuit of the present disclosure has a simple structure and occupies a small chip area.

DETAILED DESCRIPTION

The preferred embodiments of the present disclosure will be described in detail below with reference to the accompanying drawings.

Figure 1:
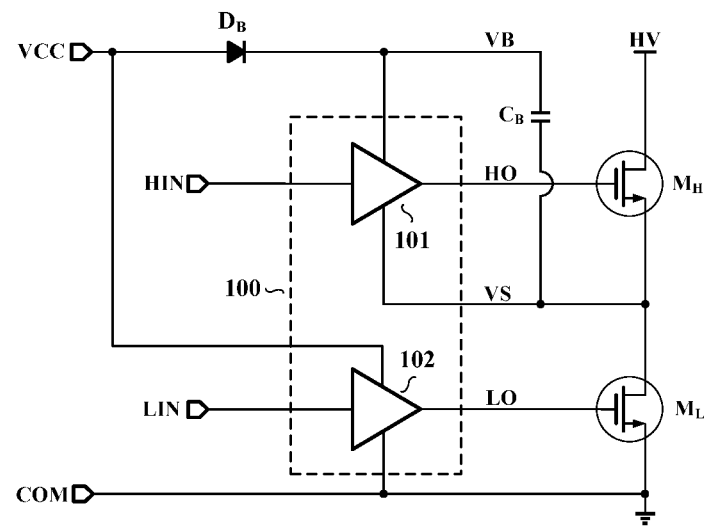
FIG. 1 is a basic topology diagram of a half-bridge driver circuit for driving an external power transistor in the related art.
Figure 2A:
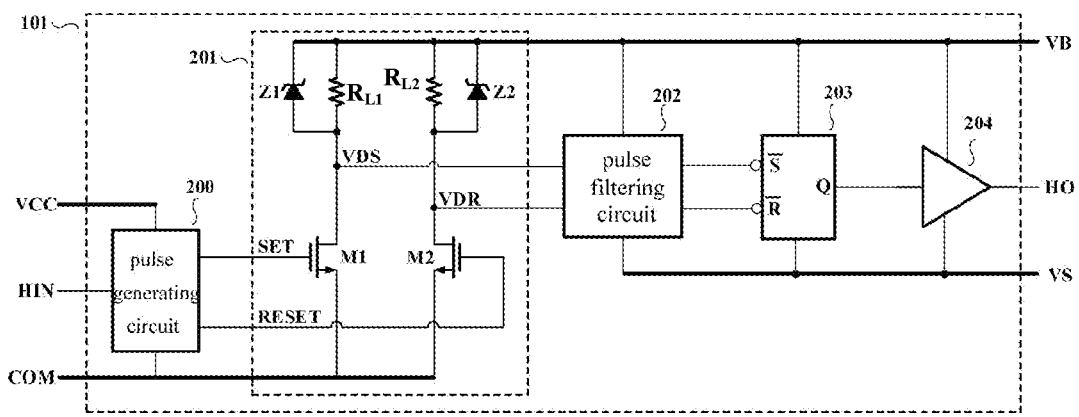
FIG. 2a is a structural diagram of a high side gate driver circuit in the related art.
Figure 2B:
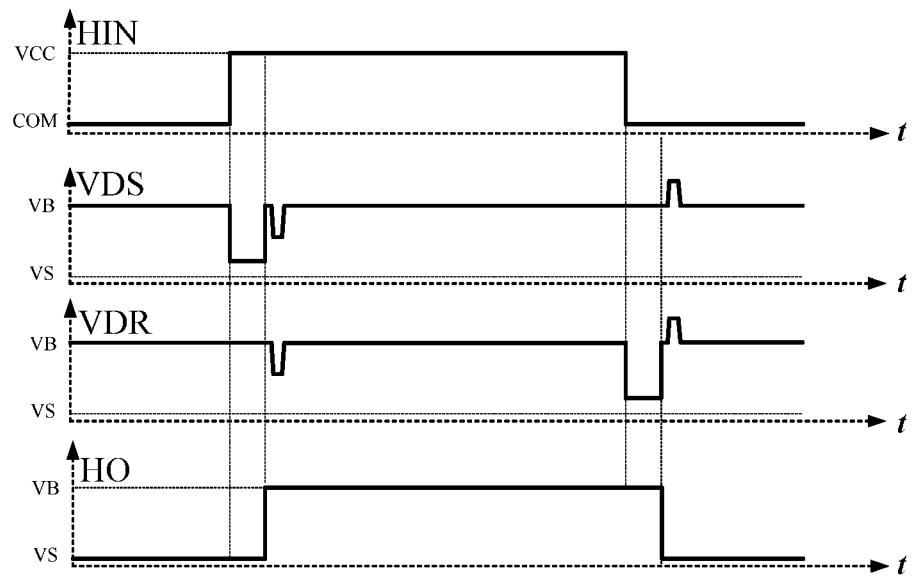
FIG. 2b is a waveform diagram of key signals of the high side gate driver circuit in the related art.
Figure 3:
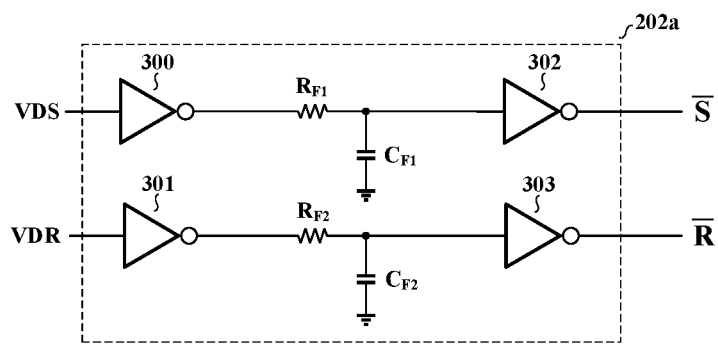
FIG. 3 is a structural diagram of an RC pulse filtering circuit in the related art.
Figure 4:
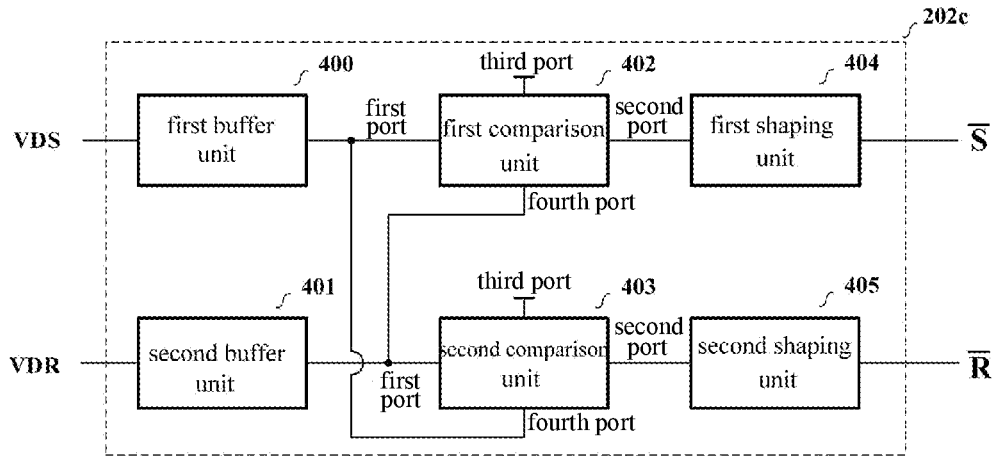
FIG. 4 is a structural diagram of a new pulse filtering circuit according to an embodiment of the present disclosure.

As shown in FIG. 4, a new pulse filtering circuit provided in an embodiment of the present disclosure has two input ports and two output ports and includes a first signal path and a second signal path. The first signal path includes a first buffer unit 400, a first comparison unit 402, and a first shaping unit 404. The second signal path includes a second buffer unit 401, a second comparison unit 403, and a second shaping unit 405. Each of the buffer units 400, 401 includes one or more digital inverters in series, with the input to the first digital inverter serving as the input to the pulse filtering circuit, and an output of the last digital inverter serving as an output of the buffer unit, optionally such buffer unit can be omitted. Each of the first comparison unit 402 and the second comparison unit 403 has four ports which are a first port, a second port, a third port, and a fourth port, respectively, in which the first port serves as an input control port of the first comparison unit 402 (or the second comparison unit 403). The second port serves as an output port of the first comparison unit 402 (or the second comparison unit 403), the third port serves as a fixed potential port of the first comparison unit 402 (or the second comparison unit 403), and the fourth port serves as a floating potential input port of the first comparison unit 402 (or the second comparison unit 403). The output of the first buffer unit 400 connects to the input control port of the first comparison unit 402 and the floating potential input port of the second comparison unit 403, the output of the second buffer unit 401 connects to the input control port of the second comparison unit 403 and the floating potential input port of the first comparison unit 402, or alternatively the output of the first buffer unit 400 connects to the input control port of the second comparison unit 403 and the floating potential input port of the first comparison unit 402, the output of the second buffer unit 401 connects to the input control port of the first comparison unit 402 and the floating potential input port of the second comparison unit 402. Signal from each of the floating potential input port is passed to the corresponding output port when a voltage difference between the corresponding input control port and the floating potential input port exceeds a voltage threshold VTH of the comparison unit, otherwise the corresponding output port provides an output equal to the fixed potential at the third port. The first shaping unit 404 includes one or more digital inverters in series, with an input to the first digital inverter connecting to the output of the first comparison unit 402, and an output of the last digital inverter serving as a first output of the pulse filtering circuit, and the second shaping unit includes one or more digital inverters in series, with an input to the first digital inverter connecting to the output of the second comparison unit 403, and an output of the last digital inverter serving as a second output of the pulse filtering circuit; optionally, each such buffer unit can be omitted. The third ports of the first comparison unit 402 and the second comparison unit 403 depending on the device level circuit selected may be connected with a power supply signal or a ground signal; and the first comparison unit 402 and the second comparison unit 403 each may include one or more digital inverters.

Figure 5:
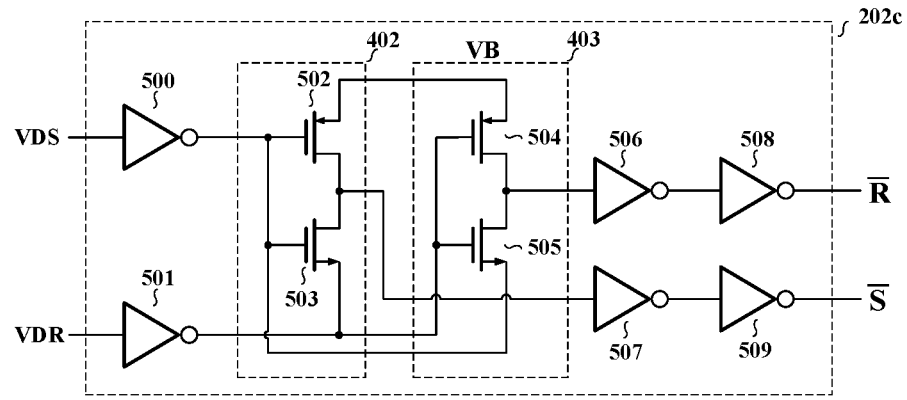
FIG. 5 is a diagram of a new pulse filtering circuit according to an embodiment of the present disclosure.

As shown in FIG. 5, the new pulse filtering circuit according to an embodiment of the present disclosure may adopt the following structure: the first buffer unit 400 comprises a first digital inverter 500 and the second buffer unit 401 comprises a second digital inverter 501; the first comparison unit 402 comprises a first PMOS transistor 502 and a first NMOS transistor 503, a gate electrode of the first PMOS transistor 502 and a gate electrode of the first NMOS transistor 503 are connected together to serve as the first port of the first comparison unit 402, a drain electrode of the first PMOS transistor 502 and a drain electrode of the first NMOS transistor 503 are connected together to serve as the second port of the first comparison unit 402, a source electrode of the first PMOS transistor 502 serves as the third port of the first comparison unit 402, and a source electrode of the first NMOS transistor 503 serves as the fourth port of the first comparison unit 402.

The second comparison unit 403 comprises a second PMOS transistor 504 and a second NMOS transistor 505. A gate electrode of the second PMOS transistor 504 and a gate electrode of the second NMOS transistor 505 are connected together to serve as the first port of the second comparison unit 403, a drain electrode of the second PMOS transistor 504 and a drain electrode of the second NMOS transistor 505 are connected together to serve as the second port of the second comparison unit 403, a source electrode of the second PMOS transistor 504 serves as the third port of the second comparison unit 403, and a source electrode of the second NMOS transistor 505 serves as the fourth port of the second comparison unit 403.

The first shaping unit 404 comprises a third digital inverter 506 and a fourth digital inverter 508. The second shaping unit 405 comprises a fifth digital inverter 507 and a sixth digital inverter 509. The third port of the first comparison unit 402 and that of the second comparison unit 403 are connected with the power supply signal. When an absolute value of a voltage difference between the first port and the fourth port of the first comparison unit 402 or the first port and the fourth port of the second comparison unit 403 is greater than the voltage threshold of the first comparison unit or the voltage threshold of the second comparison unit, signals at output ends $\overline{S}$ and $\overline{R}$ are changed as the result of passing of signal from the fourth port to the second port of the comparison unit.

Figure 6:
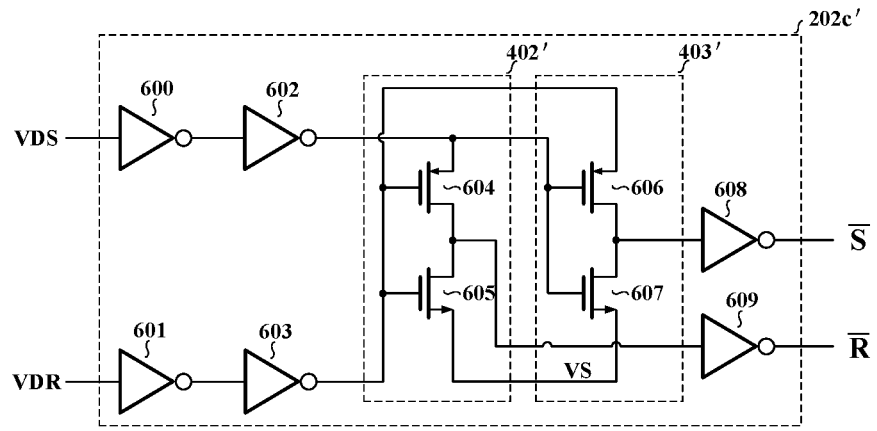
FIG. 6 is a diagram of a new pulse filtering circuit according to another embodiment of the present disclosure.

As shown in FIG. 6, the new pulse filtering circuit according to an embodiment of the present disclosure may adopt another structure, in which the first buffer unit 400 comprises a seventh digital inverter 600 and an eighth digital inverter 602, and the second buffer unit 401 comprises a ninth digital inverter 601 and a tenth digital inverter 603. The first comparison unit 402 comprises a third PMOS transistor 604 and a third NMOS transistor 605. A gate electrode of the third PMOS transistor 604 and a gate electrode of the third NMOS transistor 605 are connected together to serve as the first port of the first comparison unit 402, a drain electrode of the third PMOS transistor 604 and a drain electrode of the third NMOS transistor 605 are connected together to serve as the second port of the first comparison unit 402, a source electrode of the third NMOS transistor 605 serves as the third port of the first comparison unit 402, and a source electrode of the third PMOS transistor 604 serves as the fourth port of the first comparison unit 402.

The second comparison unit 403 comprises a fourth PMOS transistor 606 and a fourth NMOS transistor 607, a gate electrode of the fourth PMOS transistor 606 and a gate electrode of the fourth NMOS transistor 607 are connected together to serve as the first port of the second comparison unit 403, a drain electrode of the fourth PMOS transistor 606 and a drain electrode of the fourth NMOS transistor 607 are connected together to serve as the second port of the second comparison unit 403, a source electrode of the fourth NMOS transistor 607 serves as the third port of the second comparison unit 403, and a source electrode of the fourth PMOS transistor 606 serves as the fourth port of the second comparison unit 403.

The first shaping unit 404 comprises an eleventh digital inverter 608, and the second shaping unit 405 comprises a twelfth digital inverter 609; the third port of the first comparison unit 402 and the third port of the second comparison unit 403 are connected with the ground signal. Signals at output ends $\overline{S}$ and $\overline{R}$ are changed when an absolute value of a voltage difference between the first port and the fourth port of the first comparison unit or the first port and the fourth port of the second comparison unit is greater than the voltage threshold of the first comparison unit 402 or the voltage threshold of the second comparison unit 403.

Figure 7:
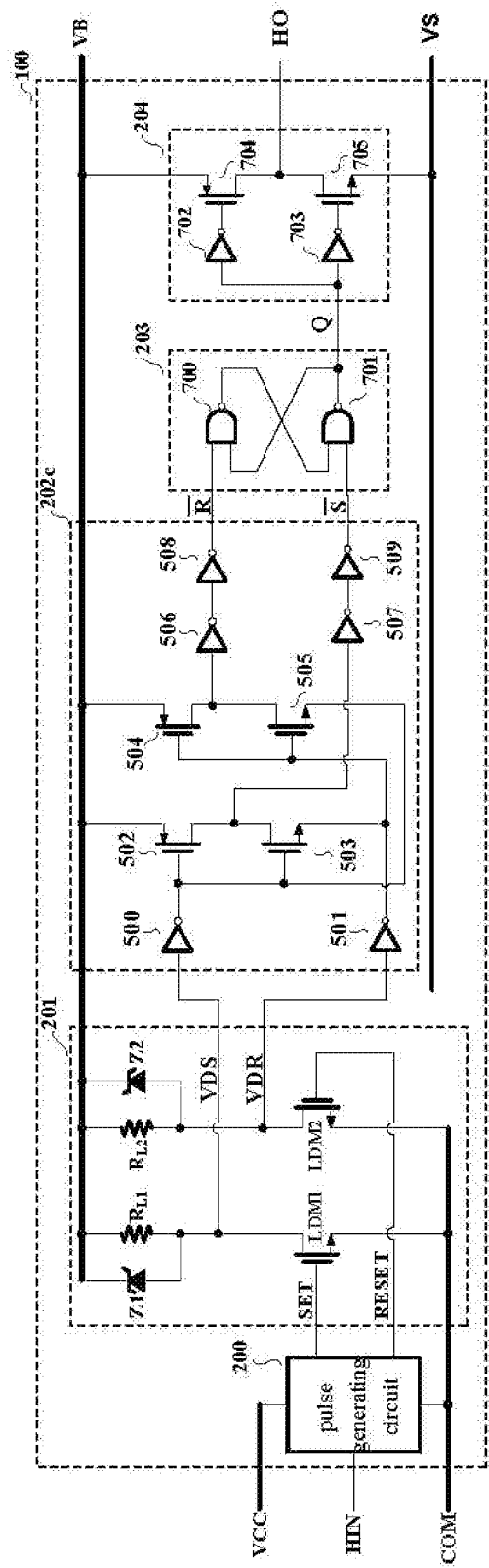
FIG. 7 is a diagram of a high side gate driver circuit according to an embodiment of the present disclosure.

FIG. 7 shows a specific embodiment of a high side gate driver circuit where the new pulse filtering circuit according to an embodiment of the present disclosure is applied, the high side gate driver circuit includes a narrow pulse generating circuit 200, a high voltage level shift circuit 201, a new pulse filtering circuit 202c, an RS flip-flop 203 and a gate driver circuit 204. An input end of the narrow pulse generating circuit 200 is HIN, output ends of the narrow pulse generating circuit 200 are SET and RESET which serve as two input ends of the high voltage level shift circuit 201. Output ends of the high voltage level shift circuit 201 are VDS and VDR which serve as two input ends of the new pulse filtering circuit 202c at the same time. Two output ends of the new pulse filtering circuit 202c are connected with a set input end $\overline{S}$ and a reset input end $\overline{R}$ of the RS flip-flop 203, respectively, an output end Q of the RS flip-flop 203 is connected with an input end of the gate driver circuit 204, an output end of the gate driver circuit 204 is HO. A power supply end of the narrow pulse generating circuit 200 is connected with a low-side fixed power supply VCC. A logic ground of the narrow pulse generating circuit 200 is connected with a ground signal COM. Power supply ends of the new pulse filtering circuit 202c, the RS flip-flop 203 and the gate driver circuit 204 are connected with a high-side floating power supply VB, and logic grounds of the new pulse filtering circuit 202c, the RS flip-flop 203 and the gate driver circuit 204 are connected with a high-side floating ground VS. A logic ground of the high voltage level shift circuit 201 is connected with the ground signal COM, and a logic power supply of the high voltage level shift circuit 201 is connected with the high-side floating power supply VB.

Figure 8:
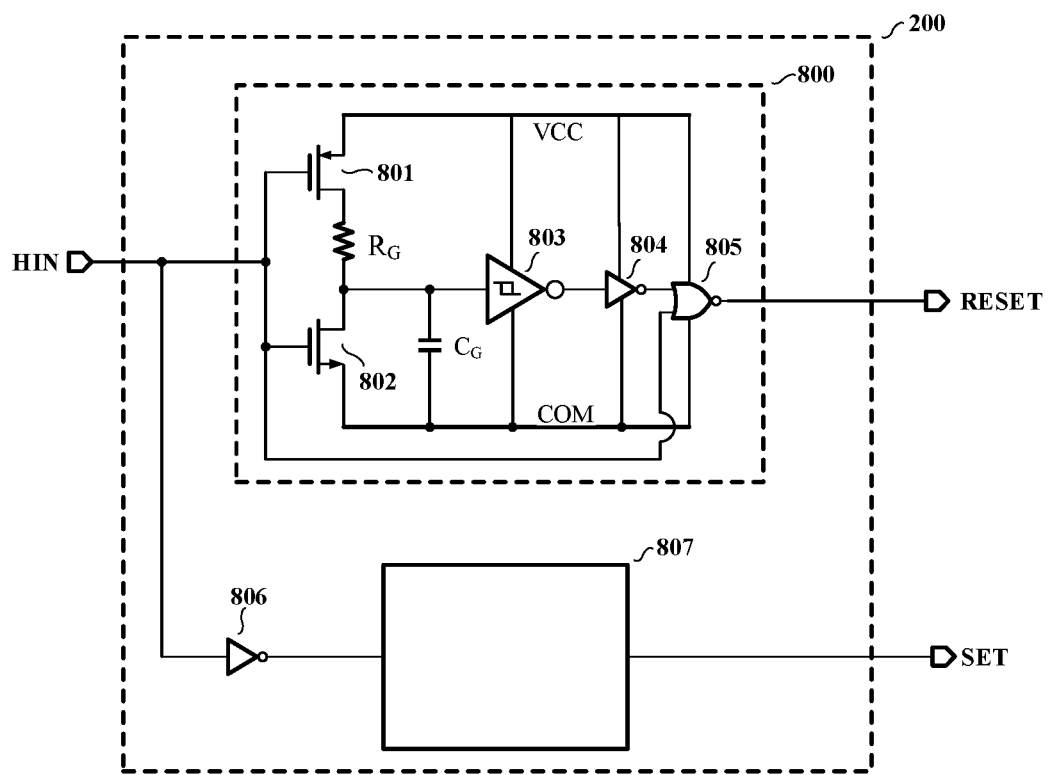
FIG. 8 is a diagram of a narrow pulse generating circuit according to an embodiment of the present disclosure.

As shown in FIG. 8, a specific implementation of the narrow pulse generating circuit 200 is provided. The narrow pulse generating circuit 200 comprises a first path and a second path, the first path includes a first single pulse generating circuit 800, and the second path includes a digital inverter 806 and a second single pulse generating circuit 807. The first single pulse generating circuit 800 and the second single pulse generating circuit 807 have the same structure and both comprise a resistor, a capacitor, a Schmitt trigger, a digital inverter and a NOR gate. A gate electrode of a fifth PMOS transistor 801 and a gate electrode of a fifth NMOS transistor 802 are connected with a first input end of the NOR gate 805, serving as an input end of the single pulse generating circuit 800; a drain electrode of the fifth PMOS transistor 801 is connected with a first end of the resistor $R_G$; a drain electrode of the fifth NMOS transistor 802, a second end of the $R_G$, a first end of the capacitor $C_G$ are connected with an input end of the Schmitt trigger 803; a source electrode of the fifth PMOS transistor 801 is connected with a low-side fixed power source VCC; a source electrode of the fifth NMOS transistor 802 is connected with a ground signal COM; an output end of the Schmitt trigger 803 is connected with an input end of a thirteenth digital inverter 804; an output end of the thirteenth digital inverter 804 is connected with a second input end of the NOR gate 805, an output end of the NOR gate 805 serves as an output end of the first single pulse generating circuit 800. A function of the narrow pulse generating circuit 200 is to convert a high-side input signal HIN into two narrow pulse signals which represent a rising edge and a falling edge of the input signal HIN, respectively. A high voltage switching device in the high voltage level shift circuit 201 is driven by the two narrow pulse signals.

As shown in FIG. 7, the high voltage level shift circuit 201 includes high voltage power switching devices (LDM1, LDM2), load resistors ($R_{L1}$, $R_{L2}$) and zener diodes (Z1, Z2).

The high voltage switching devices LDM1 and LDM2 are LDMOS devices. A gate electrode of the LDM1 is connected with the SET signal, a gate electrode of the LDM2 is connected with the RESET signal, a drain electrode of the LDM1 is connected with a first end of the resistor $R_{L1}$ and a first end of the zener diode Z1, a drain electrode of the LDM2 is connected with a first end of the resistor $R_{L2}$ and a first end of the zener diode Z2, source electrodes of the LDM1 and LDM2 are connected with the ground signal COM, second ends of the load resistors ($R_{L1}$, $R_{L2}$) and second ends of the zener diodes (Z1, Z2) are connected with the high-side floating power supply VB, the drain electrode of the LDM1 serves as a first output end VDS of the high voltage level shift circuit 201, and the drain electrode of the LDM2 serves as a second output end VDR of the high voltage level shift circuit 201. A function of the high voltage level shift circuit 201 is to convert the two narrow pulse signals (SET and RESET) of the low voltage circuit into narrow pulse signals (VDS and VDR) of the high voltage circuit, respectively, so as to complete a level shift from low voltage to high voltage.

As shown in FIG. 7, in an embodiment, the new pulse filtering circuit 202c comprises digital inverters, PMOS transistors and NMOS transistors. An input end of a digital inverter 500 is connected with the output end VDS of the high voltage level shift circuit 201, an output end of the digital inverter 500 is connected with a gate electrode of a PMOS transistor 502, a gate electrode of an NMOS transistor 503, a source electrode of an NMOS transistor 505; a drain electrode of the PMOS transistor 502 and a drain electrode of the NMOS transistor 503 are connected with an input end of a digital inverter 507; an output end of the digital inverter 507 is connected with an input end of the digital inverter 509; an output end of the digital inverter 509 serves as an output end $\overline{S}$ of the new pulse filtering circuit 202c; an input end of the digital inverter 501 is connected with the output end VDR of the high voltage level shift circuit 201; an output end of the digital inverter 501 is connected with a gate electrode of a PMOS transistor 504, a gate electrode of the NMOS transistor 505 and a source electrode of the NMOS transistor 503; a drain electrode of the PMOS transistor 504 and a drain electrode of the NMOS transistor 505 are connected with an input end of a digital inverter 506; an output end of the digital inverter 506 is connected with an input end of a digital inverter 508; an output end of the digital inverter 508 serves as an output end $\overline{R}$ of the new pulse filtering circuit 202c; logic power supplies of the digital inverter 500, the digital inverter 501, the digital inverter 506, the digital inverter 507, the digital inverter 508 and the digital inverter 509 are connected with the high-side floating power supply VB; and logic power supplies of the PMOS transistor 502 and the PMOS transistor 504 are connected with the high-side floating power supply VB. Functions of the new pulse filtering circuit 202c are that: when VDS and VDR are common-mode signals, i.e., voltage values of VDS and VDR are the same, the output ends and $\overline{R}$ are at a high level; when VDS is at a high level and VDR is at a low level, $\overline{S}$ is at a high level, $\overline{R}$ is at a low level, and the high-side output HO turns to a low level; when VDS is at a low level and VDR is at a high level, $\overline{S}$ is at a low level, $\overline{R}$ is at a high level, and the high-side output HO turns to a high level.

As shown in FIG. 7, the RS flip-flop 203 according to an embodiment of the present disclosure comprises two NAND gates (700 and 701). A first input signal of the NAND gate 700 is S, and a second input signal of the NAND gate 700 is connected with an output signal Q of the NAND gate 701. A first input signal of the NAND gate 701 is $\overline{R}$, a second input signal of the NAND gate 701 is connected with an output end of the NAND gate 700, and an output signal of the RS flip-flop is Q. A function of the RS flip-flop 203 is to convert the pulse signals $\overline{S}$ and $\overline{R}$ into a square wave signal and recover the state of the high-side input signal HIN.

As shown in FIG. 7, in the gate driver circuit 204 according to an embodiment of the present disclosure, input ends of a digital inverter 702 and a digital inverter 703 are connected with the output end Q of the RS flip-flop, an output end of the digital inverter 702 is connected with a gate electrode of a PMOS transistor 704, an output end of the digital inverter 703 is connected with a gate electrode of an NMOS transistor 705, a drain electrode of the PMOS transistor 704 is connected with a drain electrode of the NMOS transistor 705 to serve as the high-side output signal HO. Functions of the gate driver circuit 204 are to increase the output driving capability of the high side gate driver circuit so as to drive the power device $M_H$, and to decrease the amount of charge discharged by the high-side floating power supply VB directly through the MP and MN as possible, so as to ensure that VB may maintain at the appropriate voltage level for a long time.

Figure 9:
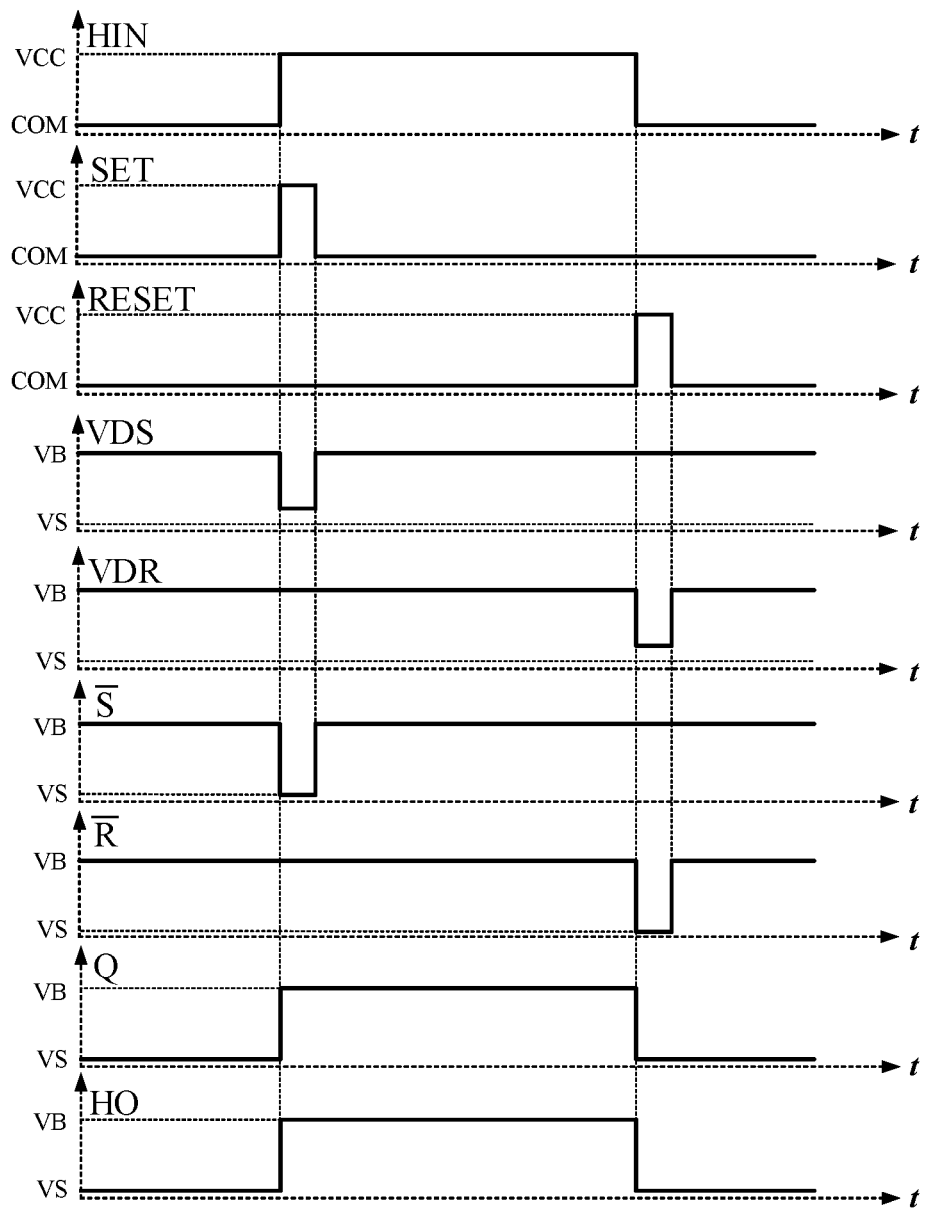
FIG. 9 is an operating waveform diagram without noise interference according to an embodiment of the present disclosure.

FIG. 9 shows an operating waveform of a circuit without dV/dt noise interference according to an embodiment of the present disclosure, a SET pulse signal is generated at the rising edge of the input signal HIN. The SET signal causes the high voltage power switching device LDM1 to be turned on, and VDS turns to a low level, after a VDS pulse signal has passed through the new pulse filtering circuit 202c, the RS flip-flop 203 is set, Q turns to a high level, HO turns to a high level; a pulse signal RESET is generated at the falling edge of the input signal HIN, the RESET signal causes the high voltage power switching device LDM2 to be turned on, after the VDR pulse signal has passed through the new pulse filtering circuit 202c, the RS flip-flop 203 is reset, and Q turns to a low level and HO turns to a low level.

Figure 10:
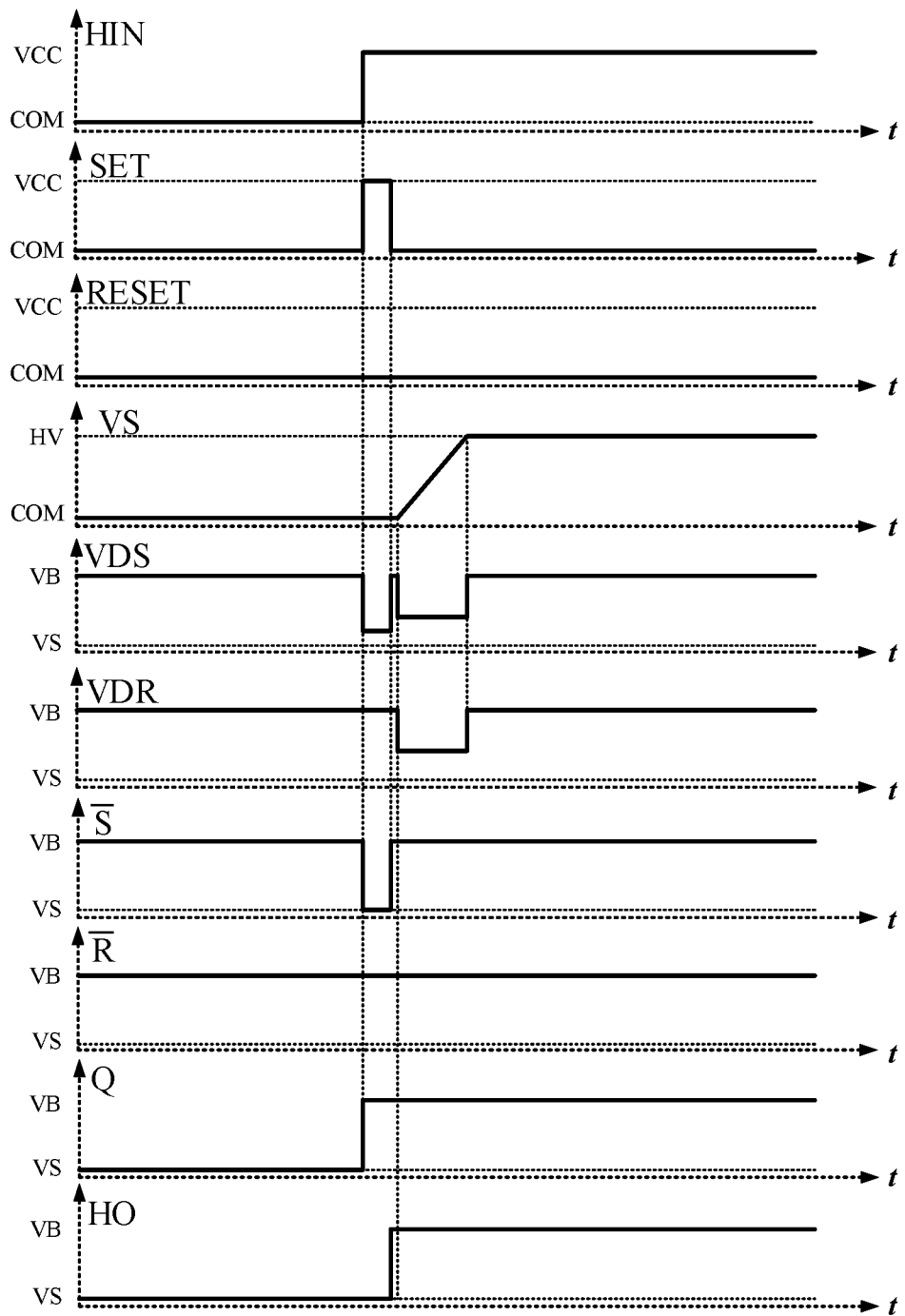
FIG. 10 is an operating waveform diagram according to an embodiment of the present disclosure where the dV/dt noise interference is present and the output HO is at a high level.

As shown in FIG. 10, the low-side input LIN is at a low level, the high-side input HIN changes from a low level to a high level, the high-side output HO turns to a high level, a power transistor $M_H$ is turned on, the high-side floating ground VS voltage rises, the variation of VS voltage is coupled through a bootstrap capacitor to the high-side floating power supply VB, a displacement current is generated at the parasitic capacitance of the high voltage switching devices (LDM1 and LDM2), and a voltage drop is generated at the load resistors ($R_{L1}$ and $R_{L2}$), which causes VDS and VDR to be at a low level with respect to VS, as VDS and VDR are the common-mode signals, they may be eliminated by the new pulse filtering circuit 202c, and would have no influence on the high-side output state.

Figure 11:
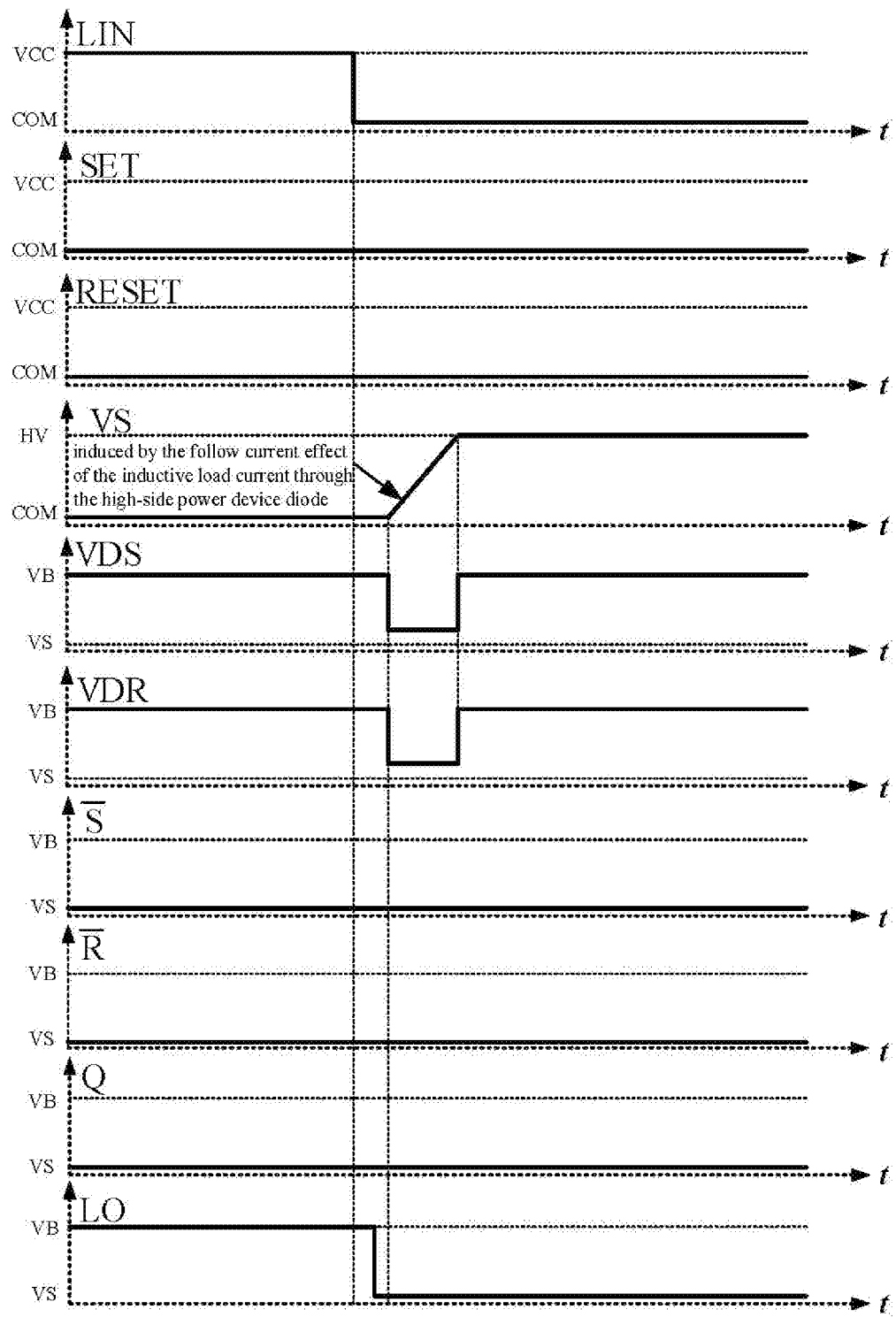
FIG. 11 is an operating waveform diagram according to an embodiment of the present disclosure where the dV/dt noise interference is present and the output HO is at a low level.

As shown in FIG. 11, the high-side input HIN is at a low level, after the low-side input LIN turns from a high level to a low level, due to the follow current effect of the inductive load current through the high-side power device diode, the voltage of the VS end rises, the high-side floating power supply VB generates a synchronous change, and thus a voltage drop is also generated at the load resistances (RL1 and RL2), which causes VDS and VDR to be at a low level relative to VS, as VDS and VDR are common-mode signals, they may be eliminated by the new pulse filtering circuit 202c, and also would have no influence on the high-side output state.

The new pulse filtering circuit of the present disclosure may eliminate the common-mode noise signal, especially the dV/dt common-mode noise generated by the power supply. Therefore, the circuit has a strong anti-dV/dt noise capability. In addition, the new pulse filtering circuit has a small transmission delay, at the same time, due to its simple circuit structure, the chip area and production costs are reduced.

It should be understood that the above detailed descriptions of embodiments of the present disclosure are illustrative and shall not be regarded as a limitation to the protection scope of the present disclosure. The protection scope of the present disclosure should be based on the appended claims.

The invention claimed is:

1. A pulse filtering circuit with two input ports and two output ports comprising:
   a first signal path with a first buffer unit, a first comparison unit, and a first shaping unit; and
   a second signal path with a second buffer unit, a second comparison unit, and a second shaping unit;
   wherein
   each of the buffer unit comprising one or more digital inverters in series, with the input to the first digital inverter serving as the input to the pulse filtering circuit, and an output of the last digital inverter serving as an output of the buffer unit; and
   each of the first comparison unit and the second comparison unit has four ports, which are a first port, a second port, a third port and a fourth port;
   wherein
   the first port of each comparison unit serves as an input control port, the second port of each comparison unit serves as an output port, the third port serves as a fixed potential port, and the fourth port serves as a floating potential input port; and
   the output of the first buffer unit connects to the input control port of the first comparison unit and the floating potential input port of the second comparison unit, the output of the second buffer unit connects to the input control port of the second comparison unit and the floating potential input port of the first comparison unit, or alternatively the output of the first buffer unit connects to the input control port of the second comparison unit and the floating potential input port of the first comparison unit, the output of the second buffer unit connects to the input control port of the first comparison unit and the floating potential input port of the second comparison unit; and
   signal from each of the floating potential input port is passed to the corresponding output port when a voltage difference between the corresponding input control port and the floating potential input port exceeds a voltage threshold of the comparison unit, otherwise the corresponding output port provides an output equal to the fixed potential at the third port; and
   the first shaping unit comprising one or more digital inverters in series, with an input to the first digital inverter connecting to the output of the first comparison unit, and an output of the last digital inverter serving as a first output of the pulse filtering circuit, and the second shaping unit comprising one or more digital inverters in series, with an input to the first digital inverter connecting to the output of the second comparison unit, and an output of the last digital inverter serving as a second output of the pulse filtering circuit.

2. The pulse filtering circuit according to claim 1, wherein the third port of the first comparison unit and the third port of the second comparison unit are connected to a power supply signal or a ground signal; and the first comparison unit and the second comparison unit each comprise one or more digital inverters.

3. The pulse filtering circuit according to claim 2, wherein the first buffer unit comprises a first digital inverter, and the second buffer unit comprises a second digital inverter.

4. The pulse filtering circuit according to claim 3, wherein the first comparison unit comprises a first PMOS transistor and a first NMOS transistor, a gate electrode of the first PMOS transistor and a gate electrode of the first NMOS transistor are connected together to serve as the first port of the first comparison unit, a drain electrode of the first PMOS transistor and a drain electrode of the first NMOS transistor are connected together to serve as the second port of the first comparison unit, a source electrode of the first PMOS transistor serves as the third port of the first comparison unit, and a source electrode of the first NMOS transistor serves as the fourth port of the first comparison unit.

5. The pulse filtering circuit according to claim 4, wherein the second comparison unit comprises a second PMOS transistor and a second NMOS transistor, a gate electrode of the second PMOS transistor and a gate electrode of the second NMOS transistor are connected together to serve as the first port of the second comparison unit, a drain electrode of the second PMOS transistor and a drain electrode of the second NMOS transistor are connected together to serve as the second port of the second comparison unit, a source electrode of the second PMOS transistor serves as the third port of the second comparison unit, and a source electrode of the second NMOS transistor serves as the fourth port of the second comparison unit.

6. The pulse filtering circuit according to claim 5, wherein the first shaping unit comprises a third digital inverter and a fourth digital inverter, the second shaping unit comprises a fifth digital inverter and a sixth digital inverter; the third port of the first comparison unit and that of the second comparison unit are connected to the power supply signal; and signals at output ends $\overline{S}$ and $\overline{R}$ are changed when an absolute value of a voltage difference between the first port and the fourth port of the first comparison unit or the first port and the fourth port of the second comparison unit is greater than the voltage threshold of the first comparison unit or the voltage threshold of the second comparison unit.

7. The pulse filtering circuit according to claim 2, wherein the first buffer unit comprises a seventh digital inverter and an eighth digital inverter, and the second buffer unit comprises a ninth digital inverter and a tenth digital inverter.

8. The pulse filtering circuit according to claim 7, wherein the first comparison unit comprises a third PMOS transistor and a third NMOS transistor, a gate electrode of the third PMOS transistor and a gate electrode of the third NMOS transistor are connected together to serve as the first port of the first comparison unit, a drain electrode of the third PMOS transistor and a drain electrode of the third NMOS transistor are connected together to serve as the second port of the first comparison unit, a source electrode of the third PMOS transistor serves as the third port of the first comparison unit, and a source electrode of the third NMOS transistor serves as the fourth port of the first comparison unit.

9. The pulse filtering circuit according to claim 8, wherein the second comparison unit comprises a fourth PMOS transistor and a fourth NMOS transistor, a gate electrode of the fourth PMOS transistor and a gate electrode of the fourth NMOS transistor are connected together to serve as the first port of the second comparison unit, a drain electrode of the fourth PMOS transistor and a drain electrode of the fourth NMOS transistor are connected together to serve as the second port of the second comparison unit, a source electrode of the fourth PMOS transistor serves as the third port of the second comparison unit, and a source electrode of the fourth NMOS transistor serves as the fourth port of the second comparison unit.

10. The pulse filtering circuit according to claim 9, wherein the first shaping unit comprises an eleventh digital inverter, and the second shaping unit comprises a twelfth digital inverter; the third port of the first comparison unit and the third port of the second comparison unit are connected with the ground signal; and signals at output ends $\overline{S}$ and $\overline{R}$ are changed when an absolute value of a voltage difference between the first port and the fourth port of the first comparison unit or the first port and the fourth port of the second comparison unit is greater than the voltage threshold of the first comparison unit or the voltage threshold of the second comparison unit.

11. A pulse filtering circuit with two input ports and two output ports comprising:
a first signal path with a first buffer unit, a first comparison unit, and a first shaping unit; and
a second signal path with a second buffer unit, a second comparison unit, and a second shaping unit;
wherein
each of the buffer unit comprising one or more digital inverters in series, with the input to the first digital inverter serving as the input to the pulse filtering circuit, and an output of the last digital inverter serving as an output of the buffer unit, optionally such buffer unit can be omitted; and
each of the first comparison unit and the second comparison unit has four ports, which are a first port, a second port, a third port and a fourth port;
wherein
the first port of each comparison unit serves as an input control port, the second port of each comparison unit serves as an output port, the third port serves as a fixed potential port, and the fourth port serves as a floating potential input port; and
the output of the first buffer unit connects to the input control port of the first comparison unit and the floating potential input port of the second comparison unit, the output of the second buffer unit connects to the input control port of the second comparison unit and the floating potential input port of the first comparison unit, or alternatively the output of the first buffer unit connects to the input control port of the second comparison unit and the floating potential input port of the first comparison unit, the output of the second buffer unit connects to the input control port of the first comparison unit and the floating potential input port of the second comparison unit; and
signal from each of the floating potential input port is passed to the corresponding output port when a voltage difference between the corresponding input control port and the floating potential input port exceeds a voltage threshold of the comparison unit, otherwise the corresponding output port provides an output equal to the fixed potential at the third port; and
the first shaping unit comprising one or more digital inverters in series, with an input to the first digital inverter connecting to the output of the first comparison unit, and an output of the last digital inverter serving as a first output of the pulse filtering circuit, and the second shaping unit comprising one or more digital inverters in series, with an input to the first digital inverter connecting to the output of the second comparison unit, and an output of the last digital inverter serving as a second output of the pulse filtering circuit; optionally, each such buffer unit can be omitted.

12. A pulse filtering circuit device, comprising: two signal paths comprising a first path and a second path; the first path comprising a first buffer circuit, a first inverter unit and a first shaping circuit; the second path comprising a second buffer circuit, a second inverter unit and a second shaping circuit; wherein each of the first inverter unit and the second inverter unit has four ports which are a first port, a second port, a third port and a fourth port, wherein the first port serves as an input end of the first inverter unit or the second inverter unit, the second port serves as an output end of the first inverter unit or the second inverter unit, the third port serves as a fixed potential end of the first inverter unit or the second inverter unit, and the fourth port serves as a floating potential end of the first inverter unit or the second inverter unit;
functions of the first inverter unit or the second inverter unit are that: an output electrical signal of the second port is controlled by a voltage difference between the first port and the fourth port, an electrical signal of the fourth port is transmitted to the second port through one of the first inverter unit and the second inverter unit if an absolute value of the voltage difference between the first port and the fourth port is greater than a voltage threshold VTH of the other of the first inverter unit and the second inverter unit; and the electrical signal of the fourth port is unable to be transmitted to the second port through one of the first inverter unit and the second inverter unit if the absolute value of the voltage difference between the first port and the fourth port is not greater than the voltage threshold VTH of the other of the first inverter unit and the second inverter unit.

13. The pulse filtering circuit device according to claim 12, wherein the respective third ports of the first inverter unit and the second inverter unit are connected to a power supply signal or a ground signal; and the first inverter unit and the second inverter unit are internally formed by one or more inverters.

14. The pulse filtering circuit device according to claim 13, wherein the first buffer circuit comprises a first inverter, and the second buffer circuit comprises a second inverter.

15. The pulse filtering circuit device according to claim 14, wherein the first inverter unit comprises a first PMOS transistor and a first NMOS transistor, a grid electrode of the first PMOS transistor and a grid electrode of the first NMOS transistor are connected together to serve as the first port of the first inverter unit, a drain electrode of the first PMOS transistor and a drain electrode of the first NMOS transistor are connected together to serve as the second port of the first inverter unit, a source electrode of the first PMOS transistor serves as the third port of the first inverter unit, and a source electrode of the first NMOS transistor serves as the fourth port of the first inverter unit.

16. The pulse filtering circuit device according to claim 15, wherein the second inverter unit comprises a second PMOS transistor and a second NMOS transistor, a grid electrode of the second PMOS transistor and a grid electrode of the second NMOS transistor are connected together to serve as the first port of the second inverter unit, a drain electrode of the second PMOS transistor and a drain electrode of the second NMOS transistor are connected together to serve as the second port of the second inverter unit, a source electrode of the second PMOS transistor serves as the third port of the second inverter unit, and a source electrode of the second NMOS transistor serves as the fourth port of the second inverter unit.

17. The pulse filtering circuit device according to claim 16, wherein the first shaping circuit comprises a third inverter and a fourth inverter, the second shaping circuit comprises a fifth inverter and a sixth inverter; the third port of the first inverter unit and that of the second inverter unit are connected to the power supply signal; and signals at output ends $\overline{S}$ and $\overline{R}$ are changed when an absolute value of a voltage difference between a first port of a first comparison unit and a first port of a second comparison unit is greater than the voltage threshold of the first inverter unit or the voltage threshold of the second inverter unit.

18. The pulse filtering circuit device according to claim 13, wherein the first buffer circuit comprises a seventh inverter and an eighth inverter, and the second buffer circuit comprises a ninth inverter and a tenth inverter.

19. The pulse filtering circuit device according to claim 18, wherein the first inverter unit consists of a third PMOS transistor and a third NMOS transistor, a grid electrode of the third PMOS transistor and a grid electrode of the third NMOS transistor are connected together to serve as the first port of the first inverter unit, a drain electrode of the third PMOS transistor and a drain electrode of the third NMOS transistor are connected together to serve as the second port of the first inverter unit, a source electrode of the third PMOS transistor serves as the third port of the first inverter unit, and a source electrode of the third NMOS transistor serves as the fourth port of the first inverter unit.

20. The pulse filtering circuit device according to claim 19, wherein the second inverter unit consists of a fourth PMOS transistor and a fourth NMOS transistor, a grid electrode of the fourth PMOS transistor and a grid electrode of the fourth NMOS transistor are connected together to serve as the first port of the second inverter unit, a drain electrode of the fourth PMOS transistor and a drain electrode of the fourth NMOS transistor are connected together to serve as the second port of the second inverter unit, a source electrode of the fourth PMOS transistor serves as the third port of the second inverter unit, and a source electrode of the fourth NMOS transistor serves as the fourth port of the second inverter unit.

* * * * *